United States Patent
Zhou et al.

[11] Patent Number: 5,879,467
[45] Date of Patent: Mar. 9, 1999

[54] CYCLE PURGING A VACUUM CHAMBER DURING BAKEOUT PROCESS

[75] Inventors: Jiaxiang Zhou; Stephen D. Dasso, both of Austin, Tex.

[73] Assignee: Applied Materials, Inc., Santa Clara, Calif.

[21] Appl. No.: 921,811

[22] Filed: Sep. 2, 1997

[51] Int. Cl.⁶ .............................. B08B 5/02; B08B 5/04; B08B 9/00
[52] U.S. Cl. ............................ 134/19; 134/21; 134/22.1; 134/22.15; 134/22.18; 134/30; 134/37
[58] Field of Search ............................ 134/19, 21, 22.1, 134/22.18, 22.15, 30, 37

[56] References Cited

U.S. PATENT DOCUMENTS

| | | |
|---|---|---|
| 4,873,833 | 10/1989 | Pfeiffer et al. ............................ 62/55.5 |
| 5,433,639 | 7/1995 | Zahuta et al. .............................. 445/40 |
| 5,536,330 | 7/1996 | Chen et al. ................................ 134/21 |
| 5,678,759 | 10/1997 | Grenci et al. ............................ 237/1 R |

*Primary Examiner*—Zeinab El-Arini
*Attorney, Agent, or Firm*—Patterson & Associates

[57] ABSTRACT

A vacuum system bakeout process is performed by cycling the system between two pressures, pumping the system down to a lower pressure, and holding the system at that lower pressure for a period of time. A gas, such as argon gas, is introduced into the system. This gas introduction is done while cycling between the two pressures. The pump is used to lower the pressure during cycling, and the gas flow is used to raise the pressure. A rough pump performs the cycling between pressures, and then a high vacuum pump evacuates the system to the lower pressure.

35 Claims, 6 Drawing Sheets

CYCLE PURGING A VACUUM CHAMBER DURING BAKEOUT PROCESS

BACKGROUND OF THE INVENTION

1. Field of the Invention

The present invention relates generally to a method for achieving the highest vacuum possible in the least amount of time for a given vacuum chamber. More specifically, the present invention relates to a method of performing a bakeout on a vacuum chamber involving cycle purging the chamber.

2. Background of the Related Art

Vacuum chambers are well known. Vacuum chambers can be used to manufacture integrated circuits (ICs) on silicon wafers. Physical vapor deposition (PVD) chambers are one type of vacuum chamber for manufacturing ICs. PVD chambers usually must reach about $6.0 \times 10^{-9}$ torr to qualify for use in manufacturing ICs.

The traditional method used for qualifying the vacuum of an ultra high vacuum chamber is called a bakeout. The bakeout process accelerates the removal of contaminants from the chamber, including driving out water vapor and other gases from the chamber components. The bakeout process is used to determine the highest vacuum, or lowest pressure, that the vacuum chamber can attain. A vacuum chamber's highest vacuum may be limited by a variety of reasons, including leaks in the chamber or contaminants in the chamber.

Various gases that have adsorbed onto the walls, instruments or other interior surfaces of the chamber may comprise the contaminants that limit a chamber's highest vacuum potential. When a chamber is subjected to a vacuum, these gases come out of the interior surfaces of the chamber in a process called degassing, or outgassing or desorption. When the pressure is returned to atmospheric pressure, such as prior to opening the chamber, water vapor and other gases in the chamber may be adsorbed into the interior surfaces of the chamber, only to be outgassed later when the vacuum returns.

The first time that a vacuum chamber is subjected to a vacuum, i.e., during the first bakeout, there may be a considerable amount of contaminants, absorbed or adsorbed gases, that must be outgassed. Subsequent times that the vacuum chamber is subjected to a vacuum should not have as many contaminants to outgas if the chamber can be kept relatively free of such contaminants in the interim. Thus, the first bakeout process is usually the longest period during which outgassing must be done.

The conventional method used to obtain an ultra-high vacuum for a chamber is to pump the chamber using a roughing pump to about 100 millitorr, then crossover to the high vacuum pump. After the chamber reaches a threshold pressure, an extensive bakeout, e.g. 36 hours in a PVD chamber, is performed. During the bakeout process, the high vacuum pump continuously pumps the chamber. Afterwards, the chamber must be cooled to ambient temperature in order to reach the base pressure, which may take about ten more hours.

An example of the conventional bakeout method can be seen in FIG. 1, which is a graph of pressure (in torr) inside the vacuum chamber versus time (in hours). Prior to time 100, the roughing pump brings the vacuum down to about 0.1 torr. Then the high vacuum pump, e.g., cryogenic pump, reduces the vacuum as low as about $2 \times 10^{-6}$ torr. At time 100, the bakeout lamps are turned on and the chamber will heat up, causing extra outgassing in the chamber. This extra outgassing causes a rise in the pressure immediately after time 100 for 3–4 hours, after which, the pressure slowly drops for the next 10–15 hours as fewer and fewer contaminants remain to be outgassed from the chamber. At time 102, if the chamber has a wafer bakeout heater, the heater may be turned on, thus causing another rise in the pressure after time 102 when more outgassing from the heater occurs. At time 104, the bakeout test is done, the lamps and heater are turned off, and the chamber is permitted to cool until the final qualifying pressure may be determined. The time to perform this bakeout test is about 36 hours for a PVD chamber.

The problem that slows down the conventional method of performing the bakeout is the rise in pressure just after the bakeout lamps are turned on. This pressure rise is due to the speed at which the gases desorb from the chamber and are removed. For example, the outgassing rate can be calculated from the outgassing rate per area (typically $5.0 \times 10^{-7}$ torr·liter/s·cm$^2$) and the total interior surface area (typically $1.0 \times 10^{+4}$ cm$^2$ for a PVD chamber). The product of these two parameters gives a typical outgassing rate of $5.0 \times 10^{-3}$ torr·liter/s. By comparison, the cryopump's throughput can be calculated from its effective pumping speed (typically 300 to 500 liter/s with the cryopump restrictor) and the pressure in the chamber (about $5.0 \times 10^{-6}$ torr to $2.0 \times 10^{-6}$ torr). The product of these two parameters is the typical throughput for a cryopump: between about $1.5 \times 10^{-3}$ torr·liter/s and about $1.0 \times 10^{-3}$ torr·liter/s. Thus, contaminants are outgassing almost five times as fast as the cryopump can remove them, so the pressure goes back up almost an order of magnitude after initially being reduced at time 100.

The difference between the outgassing rate and the pump throughput indicates a very inefficient procedure that is permitting part of the desorbed contaminants to re-adsorb onto the interior surface of the chamber. The typical gas composition for a typical high vacuum chamber with an O-ring seal may contain as much as 50% water vapor, so water vapor and other contaminants are continually re-adsorbing onto the chamber interior, causing a long slow bakeout process.

For the process described by FIG. 1, the increase in pressure when the lamps are turned on at time 100 is known to have two parts to it. The pressure is related to temperature according to the general gas law:

$$P = nKT, \qquad \text{Equation 1}$$

where P is pressure, n is the number density of the gas molecules, K is Boltzman's constant, and T is temperature. The change in pressure may be due to a change in either the temperature T or the density n. Therefore, for a change in pressure, the general gas law may be expressed as:

$$\Delta P = nK\Delta T + KT\Delta n. \qquad \text{Equation 2}$$

If Equation 2 is divided by Equation 1, the result is:

$$\Delta P/P = \Delta T/T + \Delta n/n. \qquad \text{Equation 3}$$

The values for $\Delta P/P$ and $\Delta T/T$ can be calculated from the readings from the pressure measurement 28 and the temperature measurement 30 (see FIG. 3). A typical value for $\Delta P/P$ during bakeout is in the range of 5–7, while a typical value for $\Delta T/T$ is less than 1. From Equation 3, a typical value for $\Delta n/n$ is in the range of 4–6, which is greater than the range of values for $\Delta T/T$. Therefore, a substantial amount of the cause for the rise in pressure after time 100 in the conventional bakeout process is due to the change in density of the gas, which confirms that the cryopump is not able to pump out the desorbed gases fast enough to keep up with the outgassing rate.

Another method of performing a bakeout is shown in U.S. Pat. No. 5,536,330, issued Jul. 16, 1996, assigned to Applied Materials, Inc. of Santa Clara, Calif., and incorporated herein by reference as if fully set forth below, and assigned in common with the present application. This patent describes a bakeout process that starts with preheated gas sweeping the vacuum chamber. While maintaining a low vacuum, about 50 to 750 torr, hot gas is flowed through the chamber to sweep out as much of the degassing molecules as possible. Then the vacuum is pumped down to an ultra high vacuum to continue the bakeout process. The gas is heated before flowing into the chamber. This step requires a heater, which adds to the complexity of the test setup. Additionally, the high pressure requires a very high purity of gas to water vapor ratio, because the partial pressure due to the water vapor in the chamber will not go below that of the gas flowing into the chamber. Furthermore, the outgassing rate at the low vacuum is not very great.

Attempts have been made to enhance this procedure by raising and lowering the pressure while sweeping with preheated argon gas. However, all such attempts have been proposed at the lower vacuums that require a greater gas purity. These attempts may have had a high throughput up to about $6.0 \times 10^3$ torr·liter/s, but a low outgassing rate.

It is, therefore, desirable to have a method for performing a bakeout process that can more quickly remove the desorbed gases from a vacuum chamber, and thereby reduce the total time for the bakeout test.

SUMMARY OF THE INVENTION

A bakeout process of an ultra-high vacuum system is performed by cycling the chamber between two pressures at medium vacuum, then pumping the chamber to a high vacuum, and continuing to pump the system at the high vacuum until the end of the process.

A gas, such as argon gas, may be introduced into the system while cycling between the two pressures. The argon gas may have a purity level of 99.99%, with less than 1 ppm of water vapor. The cycling part of the process performs an initial rapid sweep of other gases or contaminants out of the system.

To perform the pressure cycling, the pump is used to lower the pressure, and the argon gas flow is used to raise the pressure. The introduction of argon gas is done periodically to create the cycles, or it may be done continuously while the pumping action is varied to create the pressure cycles.

A roughing pump performs the pressure cycles, and a high vacuum pump pumps down to and holds the vacuum at the lower pressure. Thus, the cycle pressures are kept within the range of the roughing pump, about 10 torr and 0.05 torr. At this pressure range, the pump throughput is significantly greater than the outgassing rate of the system, so the initial removal of most of the gas in the chamber occurs much more rapidly than in the prior procedure, and the gases cannot re-adsorb onto the chamber surfaces.

In one embodiment of the invention, a bakeout lamp is used during the cycling. The heat from the lamp enhances the outgassing rate from the chamber interior surfaces.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
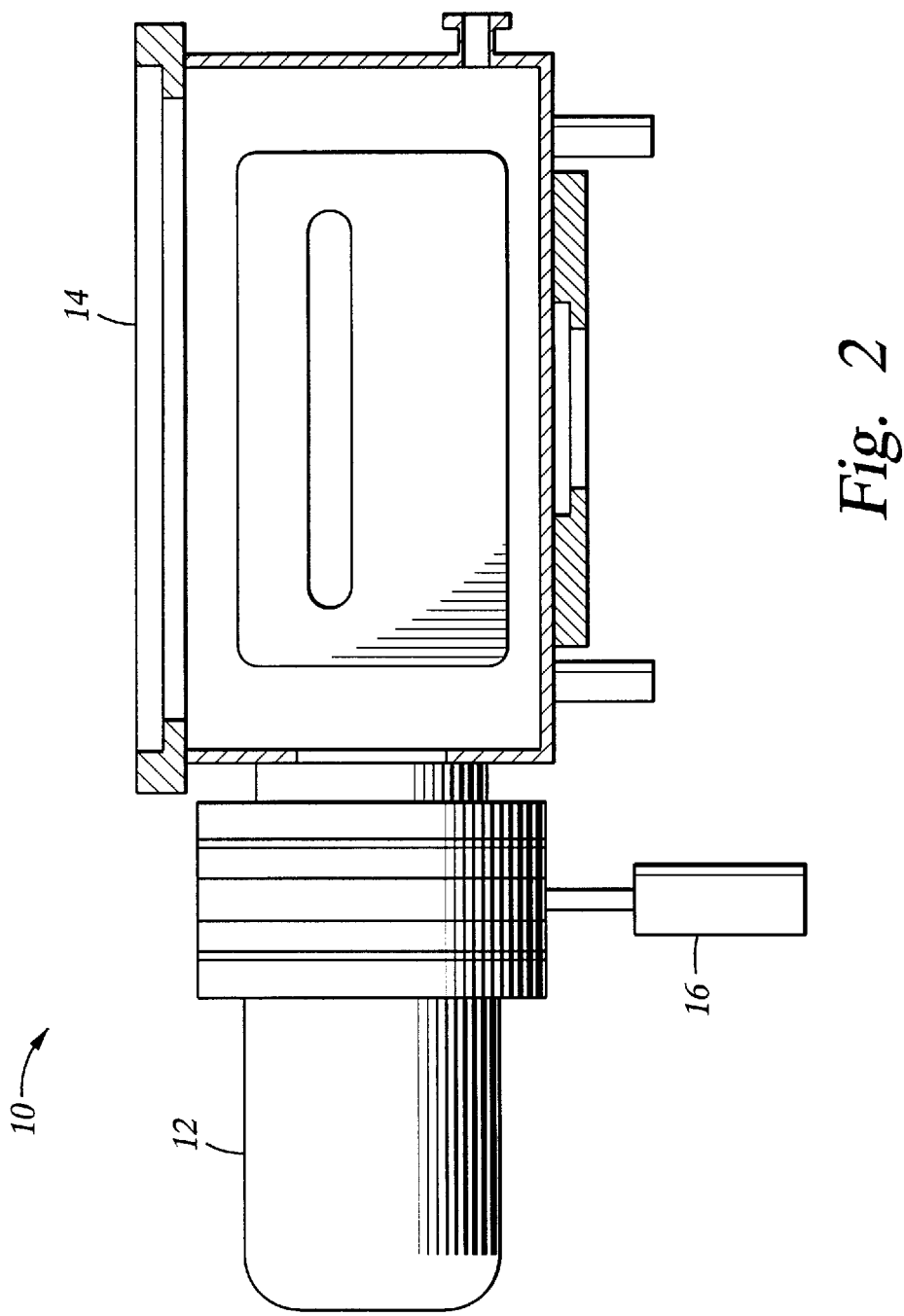
FIG. 2 shows a vacuum system that may be used with the present invention.

FIG. 2 generally shows a vacuum system 10, which may incorporate the present invention, having a pump 12 mounted on a chamber 14. A gate valve 16 generally separates the pump 12 and the chamber 14. When gate valve 16 is open, the pump 12 and the chamber 14 are in communication with each other; and when gate valve 16 is closed, the pump 12 and the chamber 14 are isolated from each other.

The vacuum system 10 may be any kind of system that has a pump that reduces the pressure of the chamber. The described embodiment relates to any vacuum system used in manufacturing IC's on silicon wafers, including a physical vapor deposition (PVD) vacuum system, a chemical vapor deposition (CVD) vacuum system, an etch vacuum system, etc. The described embodiment specifically shows a PVD vacuum system, but it is to be understood that the present invention is not restricted to this one embodiment.

Pump 12 includes a pump for high vacuum pumping. Additionally, a roughing pump is connected through a foreline to chamber 14 in a known manner. Except where specifically noted, references to a pump in this description are to the high vacuum pump since the vacuum test described herein operates in the high vacuum region. High vacuum pumps include a cryogenic pump (sometimes called a cryopump), a turbomolecular pump, and a getter pump. In the following description, the invention is described as including a cryopump; however, it should be understood that any of the other types of high vacuum pumps could be used in accordance with the present invention.

When gate valve 16 is open, the pump can pump down chamber 14 and maintain both sections in a high vacuum. When gate valve 16 is closed, the pump will usually continue to try to maintain the high vacuum; but since it is cut off from its pump, the vacuum in chamber 14 has nothing to maintain it, so the pressure in the chamber can rise if there is a source for gases to enter it. In fact, it is expected that small amounts of gases may continue to desorb from the interior surfaces of the chamber causing a normal rise in the chamber pressure when the gate valve is closed. A failure in chamber 14, however, may cause its pressure to rise unacceptably.

Chamber 14 includes an ion gauge, not shown, for measuring the low pressures in the chamber 14 at which most other gauges cannot operate. The ion gauge also shows the change in pressure over time. When gate valve 16 is open, the ion gauge shows the pressure in both chamber 14 and pump 12. When gate valve 16 is closed, the ion gauge shows the pressure only in chamber 14.

Figure 3:
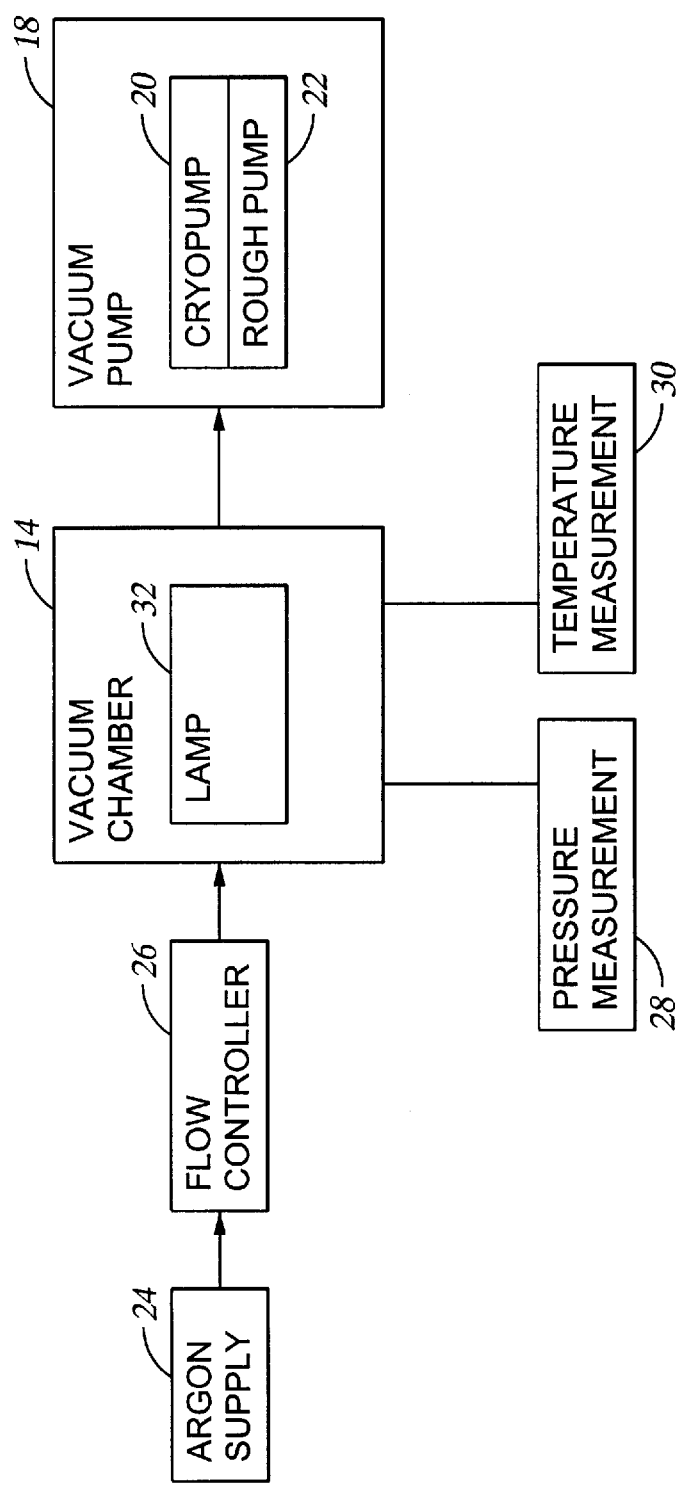
FIG. 3 is a schematic outline of the equipment used to carry out the process of the present invention.

Chamber 14 also includes one or more bakeout lamps, as shown in FIG. 3. A typical bakeout lamp contains about 99% Ar and about 1% $N_2$. The lamps may be used during bakeout and during actual manufacturing of IC's on the wafers to heat the chamber and the wafer.

FIG. 3 shows a schematic of the parts of a vacuum system. Chamber 14 has a lamp 32 as described above. The pressure measurement 28 for chamber 14 may be an ion gauge as described above. The temperature measurement 30 for chamber 14 may be any suitable device, such as a thermocouple. Vacuum pump 18 may be a system of one or more pumps. Vacuum pump 18 is part of vacuum section 12 and is shown with a cryopump 20 and a rough pump 22 as described above. Alternatively, the rough pump 22 connects directly to the chamber 14 rather than going through the vacuum section 12. An argon supply 24 provides argon for the bakeout test. A flow controller 26 regulates the flow of argon from argon supply 24 into chamber 14.

Figure 4:
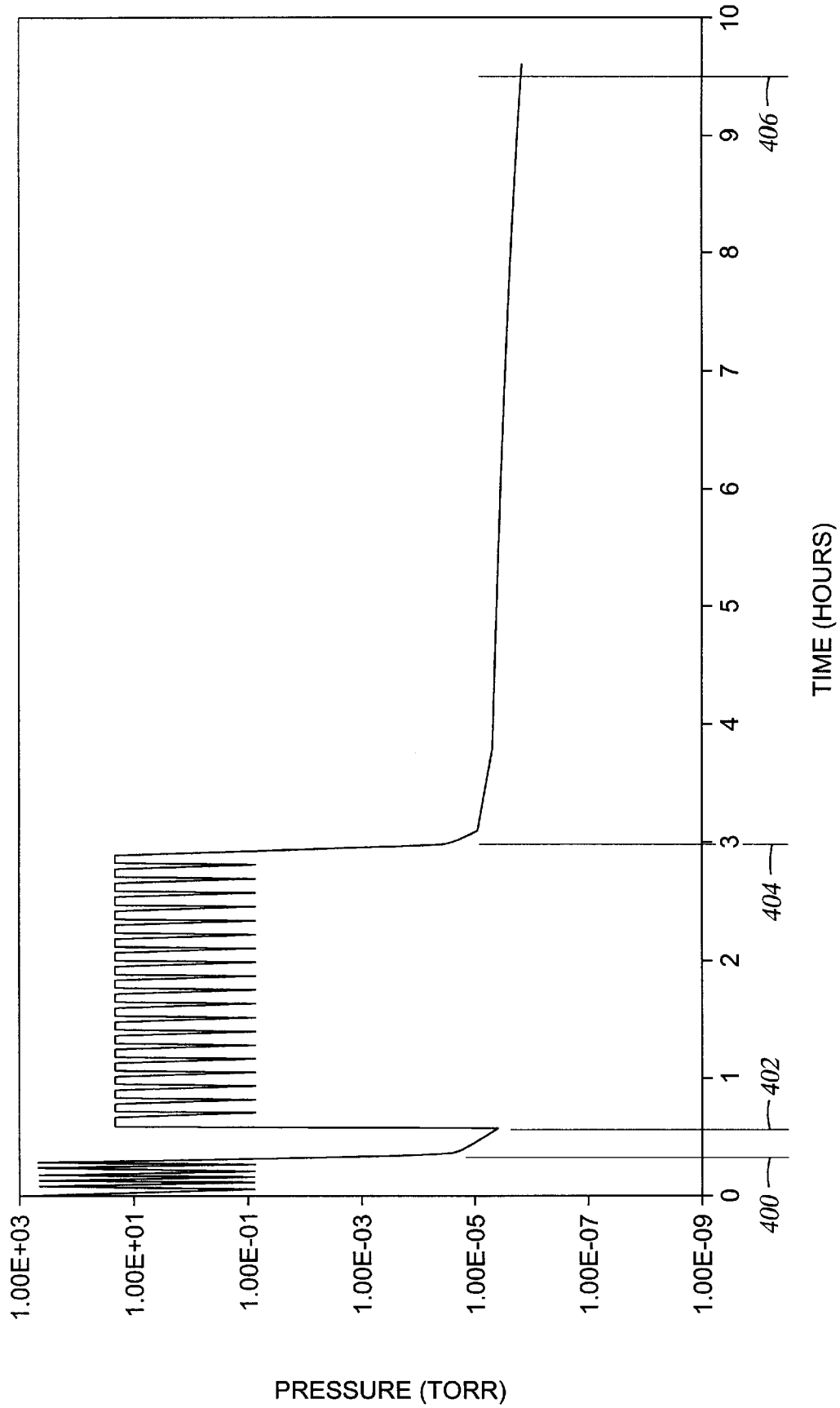
FIG. 4 is a graph of a bakeout method incorporating the present invention.

FIG. 4 shows a graph of a bakeout procedure for a chamber 14 that takes only about nine hours to perform. Prior to time 400, the gas in chamber 14 is cold purged by cycling between just below standard pressure and about 0.1 torr while flowing argon through chamber 14 in order to remove some contaminants quickly. Then between times 400 and 402, the cryopump 20 pumps down chamber 14 to less than $3 \times 10^{-6}$ torr to further remove contaminants. At time 402, the bakeout process actually begins. The pressure in chamber 14 is brought up and cycled between about 0.1 torr and about 10 torr, as described below, until time 404. The cycling time is called the ramp purge, chamber temperature ramp or cycle purge. Each cycle may have a period about five to ten minutes long. The ramping down to the lower pressure and then back up to the higher pressure may be done as quickly as possible, and then the pressure may be held at the higher pressure for the remainder of the cycle period. The cycling continues for about twenty cycles until time 404. At time 404, chamber 14 is brought to a high vacuum and held there for the remainder of the bakeout test until time 406. The high vacuum is maintained after time 406 while chamber 14 cools down. At time 406, the pressure in the chamber 14 is about $5 \times 10^{-6}$ torr, and the temperature of the interior of the chamber 14 is about 250° C. As the chamber temperature cools to about room temperature over the next few hours, the pressure will decrease to about $6 \times 10^{-9}$ torr.

Figure 5:
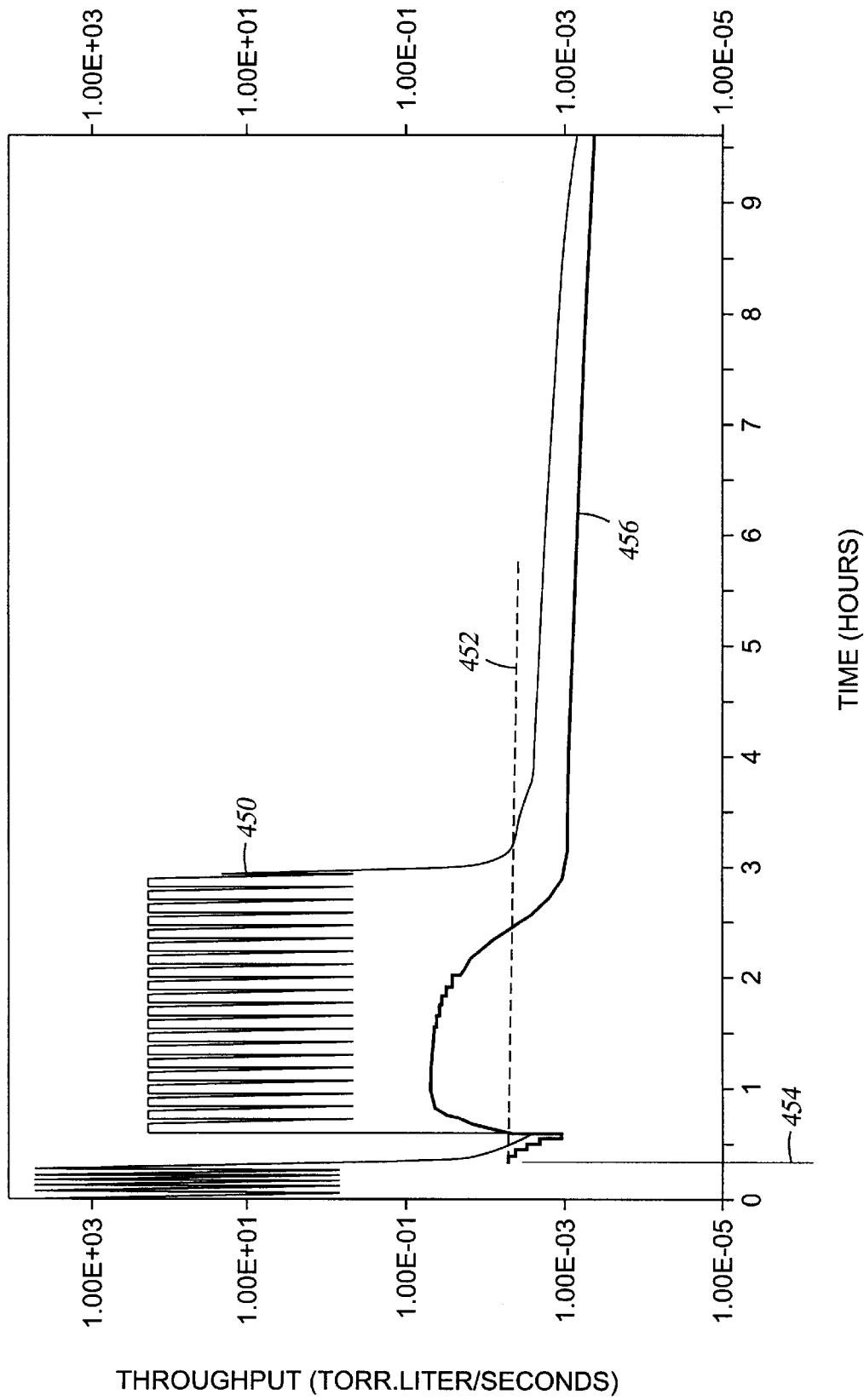
FIG. 5 is a graph of a bakeout method showing a comparison of pump throughput with chamber outgassing.
Figure 6:
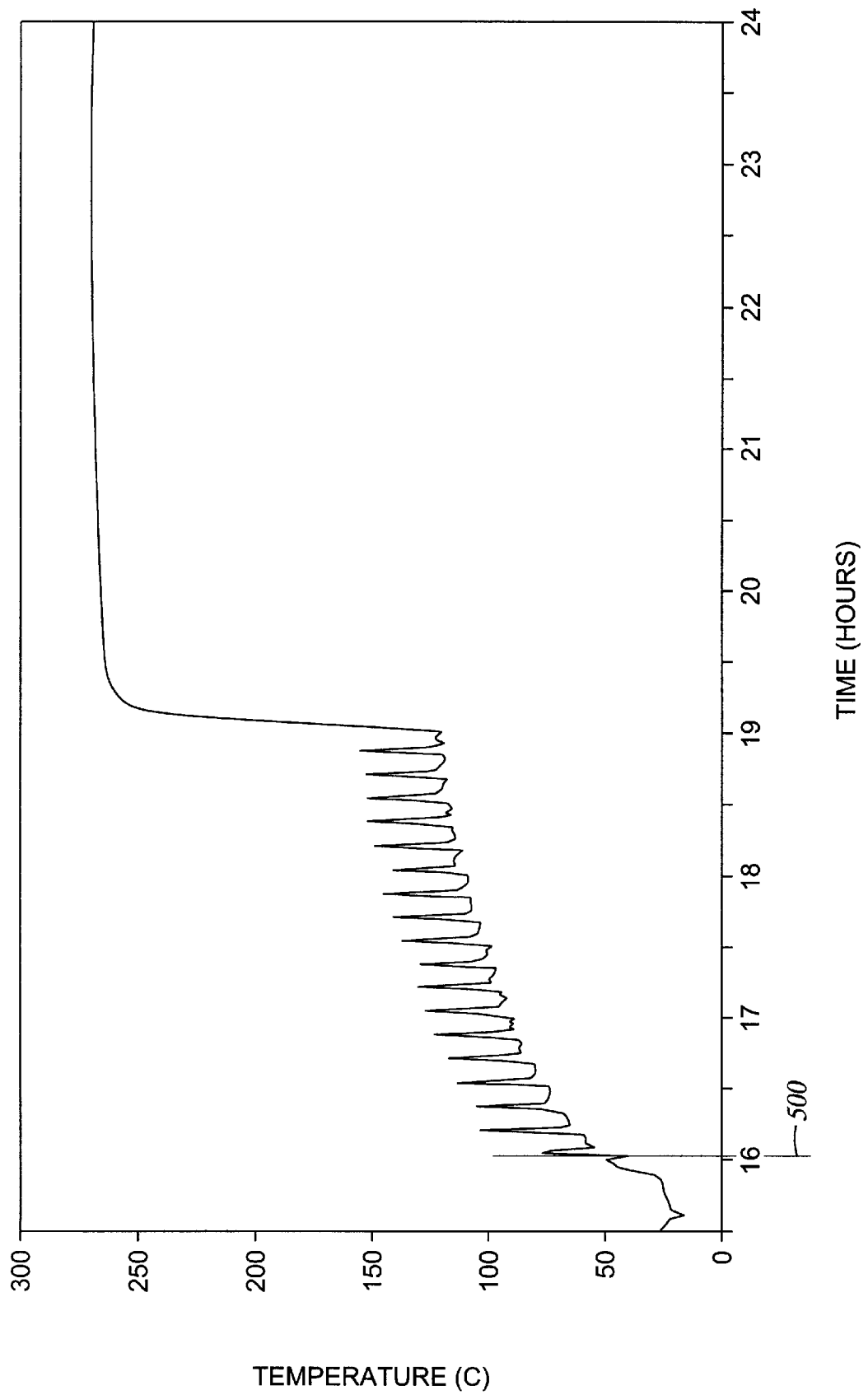
FIG. 6 is a graph of gas temperature during a bakeout method incorporating the present invention.

As shown in FIGS. 4, 5 and 6, the inventive method uses the high flow characteristics of non-cryogenic pumps, in combination with pulsing of the outgassing caused by low pressure and higher temperatures, in pressure regions where the higher capacity pumps may be used to advantage, to decrease the bakeout time for a high vacuum chamber. In the prior art, the paradigm for achieving high vacuum with good integrity, i.e. with a slow rate of rise due to outgassing, was simply to pump continuously smaller and smaller volumes of outgassed material from the chamber using a cryopump. Thus, in the prior art, any increase in pressure during the cryopumped portion of bakeout was unacceptable, because the cryopump had limited pumping capacity. The present invention counter-intuitively uses higher pressure cycling at the beginning of the bakeout period to rapidly purge or bakeout the chamber surfaces, which allows the use of higher flow rate pumps which cannot effectively operate at very low pressures, to rapidly remove the outgassed material from the chamber. Thus, when the bakeout period reaches the low pressure, low pumping speed level (the low pumping speed caused by the inherent pumping speed limitation of the cryopump), the pumping load caused by outgassing is significantly reduced, thereby allowing the cryopump to reach its base pressure far more rapidly.

With the procedure shown in FIGS. 4, 5 and 6, the bakeout test may take only about nine hours to perform. A shorter bakeout time has also been done successfully.

Bakeout lamp 32 is turned on at time 402, the beginning of the bakeout process, and held on until time 406, the end of the bakeout test. The temperature in the chamber will slowly increase from room temperature to more than 250° C., but will vary rapidly during the cycling time, as will be described below with reference to FIG. 6.

A flow of non-preheated argon gas through chamber 14 is maintained throughout the cycle purge time by argon supply 24 and flow controller 26. Vacuum pump 18 takes the argon back out of chamber 14. The argon may be heated before it enters chamber 14, since a hotter purge gas enhances the desorption of gases from the chamber interior surfaces, but it has been found not to be necessary to preheat the argon in this procedure. Instead, the bakeout lamp 32 provides sufficient heat to heat chamber 14 to enhance the desorption and removal of the contaminants, as described below with reference to FIG. 6. This setup is simpler than one which requires a heater to preheat the gas. At time 404, the argon gas flow is turned off.

Figure 1:
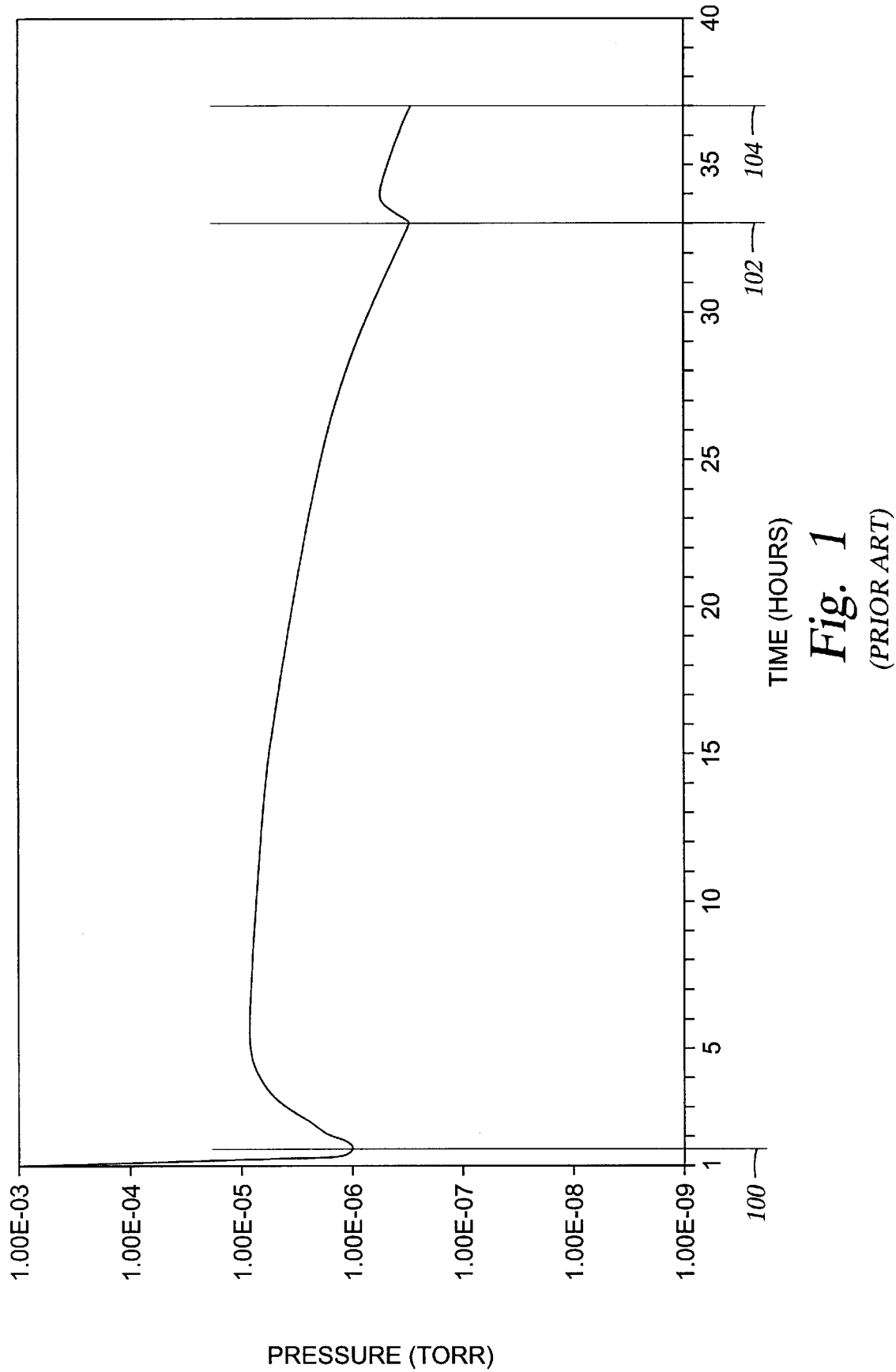
FIG. 1 is a graph of a prior art bakeout method.

The downward pressure ramp in a cycle is performed by vacuum pump 18. The upward pressure ramp is performed by the argon gas flowing into chamber 14. The argon supply 24 may be periodically opened and closed to cause these cycles. This cycling procedure strikes a balance between a high outgassing rate and a high throughput, because at the low-pressure end of each cycle the outgassing is greater, but the throughput is lower, than at the high-pressure end of each cycle, where the opposite is true. Therefore, by cycling the pressure, the procedure alternates between releasing more gas into the chamber and then flowing it out of the chamber faster. This procedure removes the gas, and hence, the contaminants, faster than a steady flow of gas does. Thus, by the time the procedure reaches the end of the pressure cycling steps, considerably more of the adsorbed gases have been removed than in the same time period for the conventional bakeout process. As a result, the rise in pressure seen in FIG. 1 following time 100 does not occur in the present procedure, so the present procedure can proceed to the end of the process much more quickly than can the conventional process.

The throughput of the pump compared with the outgassing of the chamber is shown in FIG. 5 for the cycle purging method 450 as well as for the conventional bakeout procedure 452. As can be seen beginning at time 454, the beginning of the bakeout procedure, the throughput for the cycle purge method 450 is considerably greater than the outgassing rate 456. Even during the first two hours, when the outgassing rate 456 rises considerably, the throughput of the cycle purge method 450 is always greater than the outgassing rate 456. Thus, the desorbed gases cannot be re-adsorbed onto the interior surface of the chamber 14. The throughput for the conventional bakeout method 452, however, is seen shortly after time 454 to be below the rise in the outgassing rate 456 and remains below the outgassing rate 456 for almost two hours before the outgassing rate finally drops below the throughput of the conventional bakeout method 452. This difference in throughput and outgassing rate is responsible for the rise in pressure beginning at time 100 shown in FIG. 1. The throughput level of the cycle purge method 450, by comparison, does not drop down to or below the throughput level of the conventional bakeout method 452 until after the outgassing rate 456 has decreased, so the throughput is always greater than the outgassing rate.

The cycling procedure also strikes a balance between high temperature and high throughput of gas. FIG. 6 shows the temperature of chamber 14 during an exemplary cycling procedure that is similar to the one shown in FIG. 4. The bakeout test begins at time 500, where the pressure cycling begins. When the pressure rises, the argon gas is flowing through chamber 14 at a rate of about 100 to 200 sccm. Since the argon is not preheated, it lowers the temperature as it flows into the chamber during the cycle. When the argon is turned off to let the pressure drop during a cycle, the lamp 32 heats chamber 14 to a higher temperature. At the start of the first cycle, time 500, the temperature at the high-pressure end of the pressure cycle is about 40° C. to 50° C., and the temperature at the low-pressure spike is about 70° C. to 80° C. These high/low temperature variations slowly rise until the last cycle when the temperature at the high pressure is about 120° C. to 130° C., and the temperature at the low pressure is about 150° C. to 160° C. Afterwards, since the argon flow is turned off, the temperature rises dramatically to above 250° C., where the temperature rise begins to slow down, as the pressure drop approaches its limit. Therefore, since higher temperatures cause greater outgassing rates, by cycling the temperature in this manner, the procedure once again alternates between releasing more gas from the chamber interior surfaces and then flowing it out of the chamber faster.

The purity of the argon gas is preferably at least 99.99% argon and less than one part per million water vapor. The purge gas may also be nitrogen or other inert gas.

If chamber 14 has a water bakeout heater, then it may be turned on during the cycle purge time. The heater may be slowly ramped up from 100° C. to 400° C.

During the cycle purge period, the pressure range is well within the range of rough pump 22, and during most of the time the chamber pressure is above the high pressure limit of the cryopump. Therefore, the cryopump 20 cannot be used for the cycling. Instead, the gate valve 16 has to be closed until the chamber 14 is crossed-over to the high vacuum pump at time 404.

In one example of the procedure in FIG. 4, rough pump 22 may be a scroll pump or dry pump with an effective speed of 10 liter/second. This effective speed is considerably lower than the 500 liter/second for the cryopump described above in the background of the invention. However, at a purge pressure of 10 torr, the throughput for the scroll pump may be 100 torr·liter/s, which is considerably higher than the $1.0 \times 10^{-3}$ torr·liter/s for the cryopump. Thus, the scroll pump may pump 100,000 times as much gas as the cryopump. In addition, the 100 torr·liter/s is considerably faster than the $5.0 \times 10^{-3}$ torr·liter/s outgassing rate, so the scroll pump is more than capable of removing gas fast enough to keep up with the outgassing of gases from the interior of chamber 14. As a result, the flow of argon gas and the pumping action in this bakeout procedure sweep away contaminants considerably faster than seen in the conventional bakeout process.

By the time the procedure reaches the end of twenty cycles, the bakeout lamp 32 has been on for about 2–3 hours, and the chamber temperature has already increased to about 150° C. or more, so the subsequent temperature rise after the argon flow is turned off is not as significant as it is in the conventional process when the bakeout lamp is turned on. Additionally, by this time, most of the desorbed gases from the chamber 14 have been efficiently removed, so the chamber outgassing rate has decreased. As a result, the pressure rise seen at time 100 in FIG. 1 does not occur in FIG. 4.

The higher pressure in the cycle purge time in FIG. 4 is shown to be about 10 torr, but higher cycle pressures are possible, even above 100 torr. In another example of the procedure in FIG. 4, rough pump 22 may be a dry pump with an effective speed of 5 liter/s. If the higher pressure in a cycle can be 100 torr, then the throughput for the dry pump may be 500 torr·liter/s, again considerably faster than the outgassing rate. The higher cycle pressure, however, requires a higher purity of argon gas, i.e., less water vapor, because of the partial pressure of the water. Such higher purity argon gas is difficult to obtain on a commercial basis. In contrast, the relatively lower purity argon gas is readily available commercially. It may be possible to take commercially available ultra-pure liquid argon and run it through an argon purifier to reduce the water vapor partial pressure to a level of less than 10 parts per billion prior to flowing it through chamber 14.

In yet another example, rough pump 22 may be a dry pump with an effective speed of 5 liter/s. At a purge pressure of 300 mtorr (common when there is a low flow rate from the flow controller), the throughput would be 1.5 torr·liter/s. This is still 1000 times higher than the throughput of a cryopump.

Experiments have shown that an optimum pressure for the high end of a cycle is in the range from about 0.3 torr to about 10 torr, with a preferred range being from about 0.5 torr to about 10 torr, while an optimum pressure for the low end of a cycle is in the range from about 0.05 torr to about 0.1 torr. The pressure at the low end of the cycle is actually only limited by the range of the roughing pump, since it is preferred not to have to use the cryopump.

While the foregoing is directed to the preferred embodiment of the present invention, other and further embodiments of the invention may be devised without departing from the basic scope thereof, and the scope thereof is determined by the claims which follow.

We claim:

1. A method of qualifying a vacuum system, comprising:
    (a) cycling the vacuum system between a first pressure in a range of about 0.3 torr to about 100 torr and a second pressure in a range lower than the first pressure; and
    (b) pumping the vacuum system down to a third pressure lower than the second pressure.

2. The method of claim 1, wherein cycling the vacuum system comprises introducing a gas into the vacuum system.

3. The method of claim 2, wherein the gas comprises at least about 99.99% by volume argon.

4. The method of claim 2, wherein the gas comprises less than about 1 part per million water vapor.

5. The method of claim 2, wherein the gas is not preheated before it is introduced into the vacuum system.

6. The method of claim 2, wherein cycling the vacuum system comprises:
    (d) lowering the pressure in the vacuum system by pumping the vacuum system down to the second pressure; and
    (e) raising the pressure in the vacuum system by injecting the gas into the vacuum system until the pressure in the vacuum system approximates the first pressure.

7. The method of claim 6, further comprising:

(f) repeating (d)–(e).

8. The method of claim 2, wherein introducing a gas is performed periodically during cycling.

9. The method of claim 1, further comprising:

(c) heating the vacuum system during cycling.

10. The method of claim 9, wherein heating the vacuum system comprises heating the vacuum system using a bake-out lamp.

11. The method of claim 1, wherein the first pressure is between about 0.5 torr and 10 torr.

12. The method of claim 1, wherein the second pressure is between about 0.05 torr and 0.1 torr.

13. The method of claim 1, wherein the first pressure is between about 0.3 torr and 10 torr and the second pressure is between about 0.05 torr and 0.1 torr.

14. The method of claim 1, wherein the vacuum system has a throughput greater than an outgassing rate at at least the first pressure.

15. The method of claim 1, wherein the vacuum system has a pumping throughput at the first pressure in a range of about 1.5 torr·liter/second to 500 torr·liter/second.

16. A method of qualifying a vacuum system, comprising:

(a) cycling the vacuum system between a first pressure in a range between about 0.3 torr and 100 torr and a second pressure lower than the first pressure, wherein the cycling at least partly comprises:
  (i) introducing a purge gas into the vacuum system until the vacuum system pressure approximates the first pressure; and (b) pumping the vacuum system down to about a third pressure lower than the second pressure.

17. (Amended) The method of claim 16, wherein the gas comprises less than about 1 part per million water vapor.

18. The method of claim 16, wherein the gas is not preheated before it is introduced into the vacuum system.

19. The method of claim 16, further comprising:

(e) heating the vacuum system during cycling.

20. The method of claim 19, wherein heating the vacuum system comprises heating the vacuum system using bakeout lamp.

21. The method of claim 16, wherein the first pressure is in a range of about 0.3 torr to about 10 torr.

22. The method of claim 21, wherein the second pressure is between about 0.05 torr and 0.1 torr.

23. The method of claim 16, wherein the vacuum system has a pumping throughput at at least the first pressure greater than an outgassing rate.

24. The method of claim 16, wherein the second pressure is between about 0.05 torr and 0.1 torr.

25. A method of qualifying a vacuum system, comprising:

(a) cycling the vacuum system between a first pressure in a range between about 0.3 torr to about 10 torr and a second pressure lower than the first pressure, the vacuum system having a pumping throughput at the first pressure in a range of about 1.5 torr·liter/second to 500 torr·liter/second; and (b) pumping the vacuum system down to a third pressure lower than the second pressure.

26. The method of claim 25, wherein cycling the vacuum system comprises:

(c) introducing a purge gas into the vacuum system until the vacuum system pressure approximates the first pressure, the purge gas comprising a purity of about 99.99% by volume or higher.

27. The method of claim 26, wherein the gas comprises less than about 1 part per million water vapor.

28. The method of claim 25, wherein the second pressure is between 0.05 and 0.1 torr.

29. The method of claim 25, further comprising:

(c) heating the vacuum system during cycling.

30. The method of claim 29, wherein heating the vacuum system comprises heating the vacuum system using a bake-out lamp.

31. A method of qualifying a vacuum system, comprising:

(a) heating the vacuum system; and (b) pressure cycling the vacuum system between at least a first pressure and at least a pressure, wherein a throughput of a first pump at the first pressure and at the second pressure is greater than an outgassing rate of the chamber.

32. The method of claim 31, further comprising:

(c) pumping the vacuum system down below the at least second pressure using a second pump having a throughput greater than the first pump at pressures below second pressure.

33. The method of claim 31, wherein pressure cycling comprises:

(c) pumping the vacuum system;

(d) injecting a gas into the vacuum system; and (e) repeating (c)–(d).

34. The method of claim 33 wherein (c)–(d) are preformed simultaneously.

35. The method of claim 33 wherein (c) is performed at a rate greater than the outgassing rate.

* * * * *